(12) United States Patent
Yen et al.

(10) Patent No.: US 8,421,171 B2
(45) Date of Patent: Apr. 16, 2013

(54) MAGNETIC RANDOM ACCESS MEMORY

(75) Inventors: Cheng-Tyng Yen, Kaohsiung (TW); Yung-Hung Wang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 248 days.

(21) Appl. No.: 12/960,559

(22) Filed: Dec. 6, 2010

(65) Prior Publication Data

US 2011/0241139 A1 Oct. 6, 2011

Related U.S. Application Data

(60) Provisional application No. 61/320,315, filed on Apr. 2, 2010.

(30) Foreign Application Priority Data

Jul. 21, 2010 (TW) ................................ 99124007 A

(51) Int. Cl.
*H01L 29/82* (2006.01)
*H01L 43/00* (2006.01)

(52) U.S. Cl.
USPC .................................. 257/421; 257/E29.323

(58) Field of Classification Search ........................ None
See application file for complete search history.

(56) References Cited

U.S. PATENT DOCUMENTS

| | | | |
|---|---|---|---|
| 6,967,863 B2 | 11/2005 | Huai | |
| 2009/0080238 A1 | 3/2009 | Yoshikawa et al. | |
| 2012/0040207 A1* | 2/2012 | Horng et al. | 428/811.1 |
| 2012/0155164 A1* | 6/2012 | Shukh | 365/171 |
| 2012/0206838 A1* | 8/2012 | Fuji et al. | 360/324.1 |
| 2012/0241885 A1* | 9/2012 | Hu et al. | 257/421 |

OTHER PUBLICATIONS

Liu et al., "Reduction of the spin-torque critical current by partially canceling the free layer demagnetization field", Applied Physics Letters 94, Mar. 26, 2009, 122508-1~122508-3.
Yen et al., "Reduction in critical current density for spin torque transfer switching with composite free layer", Applied Physics Letters 93, Sep. 3, 2008, 93, 092504-1~092504-3.
Mizunuma et al., "MgO barrier-perpendicular magnetic tunnel junctions with CoFe/Pd multilayers and ferromagnetic insertion layers", Applied Physics Letters 95, Dec. 11, 2009, 232516-1~232516-3.
Kim et al., "Current-induced flip-flop of magnetization in magnetic tunnel junction with perpendicular magnetic layers and polarization-enhancement layers," Applied Physics Letters 93, Dec. 12, 2008, pp. 232506-1-232506-3.

* cited by examiner

*Primary Examiner* — David S Blum
(74) *Attorney, Agent, or Firm* — Jianq Chyun IP Office

(57) ABSTRACT

A magnetic random access memory (MRAM) has a perpendicular magnetization direction. The MRAM includes a first magnetic layer, a second magnetic layer, a first polarization enhancement layer, a second polarization enhancement layer, a barrier layer, a spacer, and a free assisting layer. A pinned layer formed by the first magnetic layer and the first polarization enhancement layer has a first magnetization direction and a first perpendicular magnetic anisotropy. A free layer formed by the second magnetic layer and the second polarization enhancement layer has a second magnetization direction and a second perpendicular magnetic anisotropy. The barrier layer is disposed between the first polarization enhancement layer and the second polarization enhancement layer. The spacer is disposed on the second magnetic layer. The free assisting layer is disposed on the spacer and has an in-plane magnetic anisotropy. The spacer and the barrier layer are on opposite sides of the free layer.

9 Claims, 6 Drawing Sheets

MAGNETIC RANDOM ACCESS MEMORY

CROSS-REFERENCE TO RELATED APPLICATION

This application claims the priority benefits of U.S. provisional application no. 61/320,315, filed on Apr. 2, 2010 and Taiwan application serial no. 99124007, filed on Jul. 21, 2010. The entirety of each of the above-mentioned patent applications is hereby incorporated by reference herein and made a part of this specification.

BACKGROUND

1. Technical Field

The disclosure relates to a magnetic random access memory. Particularly, the disclosure relates to a spin transfer torque magnetic random access memory having a perpendicular magnetization.

2. Technical Art

A basic structure of a magnetic random access memory (MRAM) is formed by a pinned layer, a barrier layer and a free layer. By changing a magnetization direction of the free layer to be parallel or antiparallel to a magnetization direction of the pinned layer, a magnetoresistance thereof respectively have a low resistance state and a high resistance state for storing information.

A write operation of the conventional MRAM (for example, a mass-produced Standalone MRAM) can be implemented through a magnetic field induced by a current conducted by wires. Regarding a field-switching MRAM, the magnetic field generated by a write wire thereof is liable to interfere adjacent bits to cause write error, and as a device size decreases, a required switching field is increased, which is of no avail for miniaturization. Therefore, the MRAM at a technology below 65 nm node applies a spin transfer torque (STT) mechanism, by which an angular momentum conservation mechanism of spin-polarized electrons and a local magnetic moment is used to switch the magnetization direction of the free layer of the device, so as to implement the write operation. A STT write current is proportional to a device size, which avails miniaturization, though when the device size is reduced, magnetic anisotropy energy (KuV) stored in the free layer is also reduced, which is liable to be interfered by a random thermal perturbation field generated by temperature, so that thermal stability of the device is influenced. Although the thermal stability of the device can be improved by selecting a high saturation magnetization material or increasing a thickness of the free layer, the current required for switching is also increased. Therefore, it is an important issue in development of STT-MRAM to reduce the switching current while simultaneously maintaining a suitable thermal stability.

The MRAMs can be divided into in-plane magnetization anisotropy (IMA) MRAMs and perpendicular magnetization anisotropy (PMA) MRAMs according to material characteristics thereof. FIG. 1 is a structural cross-sectional view of a conventional IMA MRAM. Referring to FIG. 1, the IMA MRAM structure includes a magnetic pinned layer 100 having a fixed magnetization direction 102, which is not varied along with an external magnetic field, and the fixed magnetization direction 102 is used as a reference. A tunneling insulation layer 104 is disposed on the magnetic pinned layer 100. A magnetic free layer 106 is disposed on the tunneling insulation layer 104. The magnetic free layer 106 has a magnetization direction 108 capable of being switched. The magnetization direction 108 of the magnetic free layer 106 can be freely changed to be parallel or antiparallel to the magnetization direction 102 by applying the external magnetic field or current. By measuring a magnetoresistance difference generated due to parallel and antiparallel of the magnetization directions between the magnetic free layer 106 and the magnetic pinned layer 100, bit data stored in the magnetic free layer 106 can be determined.

FIGS. 2A-2B are cross-sectional views of PMA MRAM structures. Referring to FIG. 2A, the PMA MRAM structure is basically formed by staking a magnetic pinned layer 110, a tunneling insulation layer 112 and a magnetic free layer 114. A magnetization direction 120 of the magnetic pinned layer 110 is a fixed direction perpendicular to its horizontal plane. A magnetization direction 122 of the magnetic free layer 114 can also be freely switched between two directions by applying the external magnetic field or current, though it is perpendicular to its horizontal plane.

However, regarding the IMA MRAM structure of FIG. 1, if a perpendicular magnetic material is used to directly replace an in-plane magnetic material to form the PMA magnetic magnetoresistance device of FIG. 2, since an ordering direction of a multilayer film of many perpendicular magnetic materials such as Co/Pt, Co/Ne, Co/Pd, etc. is face-centered cubic (f.c.c) (111), when MgO is used as a material of the tunneling insulation layer 112, a b.c.c (002) ordering direction required for a high magnetoresistance (MR) ratio cannot be formed at the MgO interface. A low MR ratio may limit an operation speed of the device, so that a suitable polarization enhancement insertion layer is added between the perpendicular magnetic material layer and the MgO tunneling insulation layer 112 to form the ordering direction required for the high MR ratio at the MgO interface, so as to improve the MR ratio of the PMA magnetic magnetoresistance device. Referring to another PMA MRAM structure of FIG. 2B, based on the structure of FIG. 2A, insertion layers 116 and 118 are added between the perpendicular magnetic material layer and the MgO tunneling insulation layer 112. The insertion layers 116 and 118 generally have a material of CoFeB, etc., which has a high polarization and can form (002) ordering direction at the MgO interface. Although these materials are belonged to the in-plane magnetic material, based on a strong exchange coupling there between, the perpendicular magnetic material may force the magnetic moment of the in-plane magnetic material insertion layer to erect as the perpendicular magnetization direction.

Anisotropy energy of the perpendicular magnetic material is large, so that when the device size is highly miniaturized, the thermal stability thereof is still maintained. For example, regarding the perpendicular magnetic material used by a hard disc, a size of a grain thereof is only a dozen nm, though a thermal stability coefficient ($KuV/k_BT$) thereof is still greater than 60. Therefore, to use the PMA MRAM having the perpendicular magnetization direction is regarded as a key technique with a great potential for further miniaturization. However, since a damping constant of the perpendicular magnetic material is generally greater than that of the in-plane magnetic material, when the free layer of the perpendicular magnetic material is switched by the STT, a critical current density (Jc) required for the switching operation is greater than that of the in-plane magnetic material. If the critical current density required for switching the free layer of the perpendicular magnetic material can be further reduced, it avails a mass production of the PMA MRAM.

SUMMARY

The disclosure is directed to a perpendicular magnetization anisotropy (PMA) magnetic random access memory (MRAM), which can reduce a critical current density required for switching a magnetization direction of a free layer, so as to reduce a write current.

The disclosure provides a magnetic random access memory (MRAM) having a perpendicular magnetization direction. The MRAM includes a first magnetic layer, a second magnetic layer, a first polarization enhancement layer, a second polarization enhancement layer, a barrier layer, a spacer, and a free assisting layer. A pinned layer formed by the first magnetic layer and the first polarization enhancement layer has a first magnetization direction and a first perpendicular magnetic anisotropy. A free layer formed by the second magnetic layer and the second polarization enhancement layer has a second magnetization direction and a second perpendicular magnetic anisotropy. The first polarization enhancement layer is formed between the first magnetic layer and the barrier layer, the second polarization enhancement layer is formed between the second magnetic layer and the barrier layer, and the barrier layer is formed between the first polarization enhancement layer and the second polarization enhancement layer. The spacer is formed on the free layer. The free assisting layer is disposed on the spacer and has an in-plane magnetic anisotropy. The spacer and the barrier layer are on opposite sides of the free layer.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The disclosure provides a magnetic random access memory (MRAM) structure, which can reduce an operation current density. A plurality of exemplary embodiments is provided below for describing the disclosure, though the disclosure is not limited to the provided exemplary embodiments, and the exemplary embodiments can be suitably combined.

Figure 1:
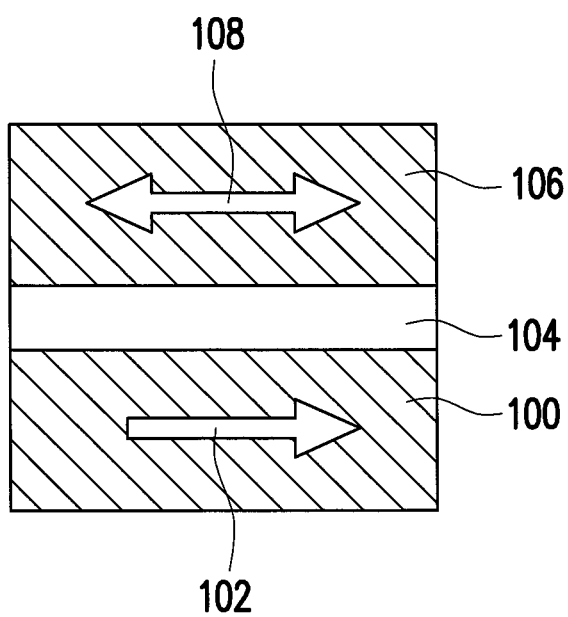
FIG. 1 is a structural cross-sectional view of a conventional in-plane magnetization anisotropy (IMA) magnetic random access memory (MRAM).
Figure 2A:
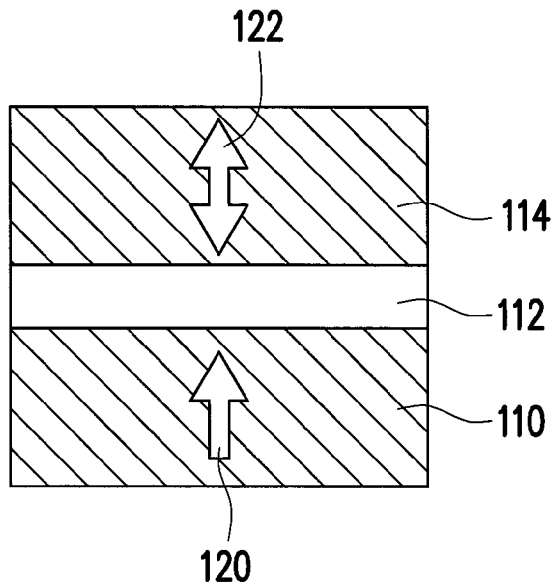
FIGS. 2A-2B are cross-sectional views of perpendicular magnetization anisotropy (PMA) MRAM structures.
Figure 2B:
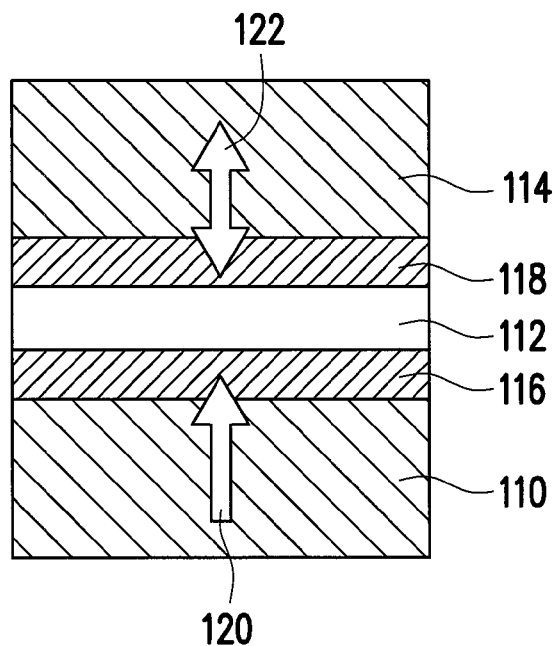
Figure 3:
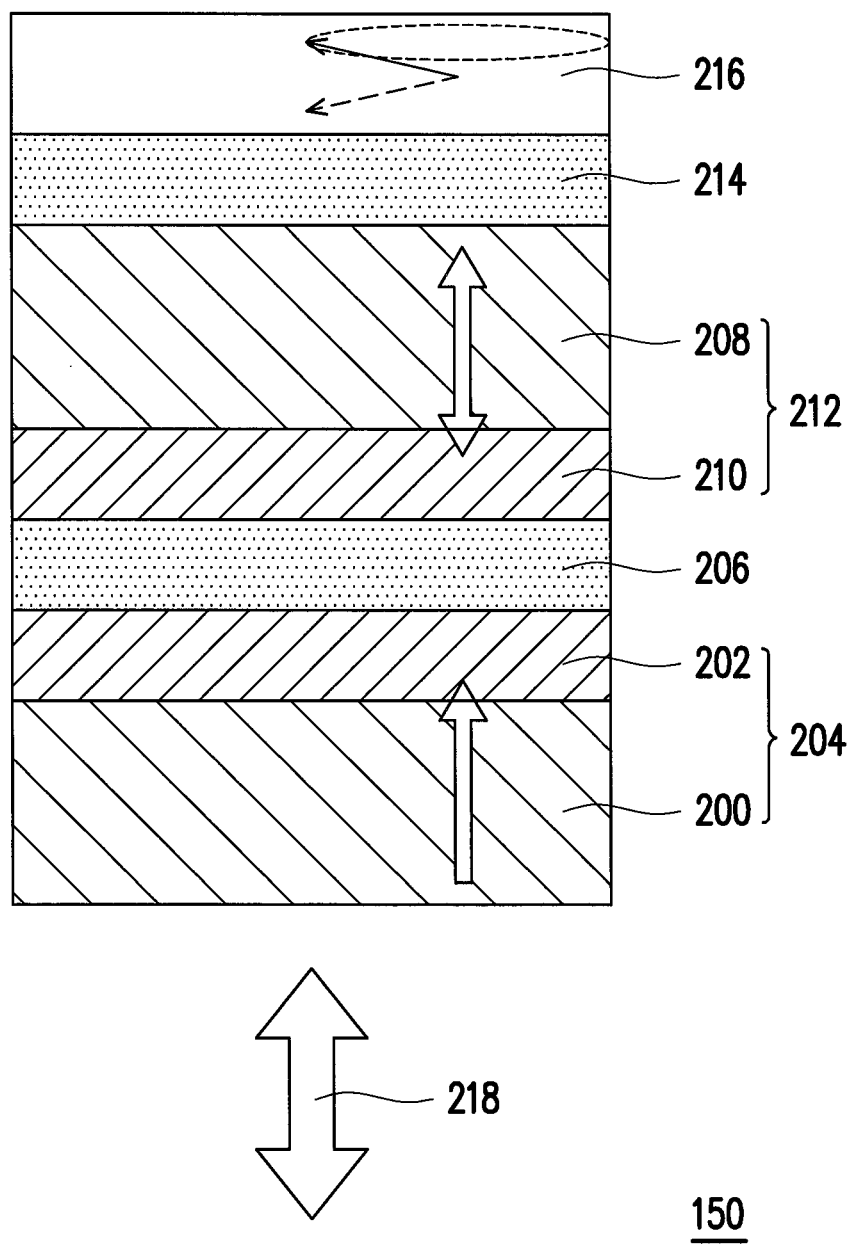
FIG. 3 is a cross-sectional view of a MRAM structure according to an exemplary embodiment of the disclosure.

FIG. 3 is a structural cross-sectional view of a MRAM device 150 according to an exemplary embodiment of the disclosure. The MRAM device 150, an isolation transistor and other required configurations (not shown) may form a memory cell of the MRAM. In FIG. 3, the MRAM device 150 includes a free layer 212 with a magnetization direction perpendicular to a film plane thereof, a pinned layer 204 with a magnetization direction perpendicular to a film plane thereof, and a barrier layer 206 between the free layer 212 and the pinned layer 204. The free layer 212 includes a second magnetic layer 208 and a second polarization enhancement layer 210. The second polarization enhancement layer 210 contacts the barrier layer 206. The pinned layer 204 includes a first magnetic layer 200 and a first polarization enhancement layer 202. The first polarization enhancement layer 202 contacts the barrier layer 206.

The first magnetic layer 200 has a first perpendicular magnetic anisotropy, and the second magnetic layer 208 has a second perpendicular magnetic anisotropy. The first perpendicular magnetic anisotropy is greater than the second perpendicular magnetic anisotropy. During a normal operation, the magnetization direction of the pinned layer 204 is perpendicular to the film plane thereof, and is not influenced by a write current 218. The magnetization direction of the free layer 212 is parallel or antiparallel to the magnetization direction of the pinned layer 204 along with a polarity of the write current 218, so that a resistance state of the MRAM device 150 is low or high for respectively recording logic "0" or logic "1".

Further, a spacer 214 is formed on the second magnetic layer 208, and a free assisting layer 216 is formed on the spacer 214. Namely, the spacer 214 is formed between the free assisting layer 216 and the free layer 212. A contact surface between the spacer 214 and the free layer 212 is located at a side of the free layer 212 opposite to a contact surface between the free layer 212 and the barrier layer 206. The free assisting layer 216 has an in-plane magnetic anisotropy. By adjusting a thickness of the spacer 214, besides a static magnetic field between the free assisting layer 216 and the free layer 212, none other interlayer exchange coupling such as a RKKY exchange coupling, etc. exists there between. The magnetization direction of the free assisting layer 216 can be freely varied along a horizontal direction. Further, based on a material characteristic, a small angle can be formed between the magnetization direction of the free assisting layer 216 and a horizontal surface of the free assisting layer 216 before the current is applied as that shown by an arrow. When the current is applied, the magnetization direction is influenced by a spin transfer torque from the free layer and is not limited to be rotated under such angle.

Figure 4:
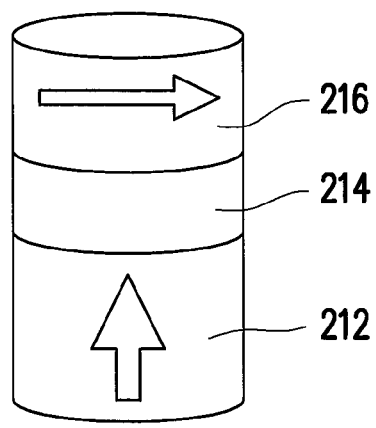
FIG. 4 is an embodiment of the disclosure in which an operation mechanism of the structure of FIG. 3 is simplified as a switching effect of a free assisting layer for a free layer.

An operation mechanism of the spacer 214 and the free assisting layer 216 is described with reference of FIG. 4. In FIG. 4, only the free layer 212, the spacer 214 and the free assisting layer 216 are briefly illustrated, and the barrier layer 206 and the pinned layer 204 are omitted, where arrows represent initial magnetization directions. Now, a polarization current is applied to switch the magnetization direction of the free layer 212 of FIG. 4 from a direction (0, 0, 1) to a direction (0, 0, −1). In the disclosure, a simulation program used by an inventor in an article entitled "Reduction in critical current density for spin torque transfer switching with composite free layer" (Appl. Phys. Letts. 93, 092504 (2008)) is used to test an effect of the structure provided by the disclosure, according to a Landau-Lifshitz-Gilbert (LLG) equation:

$$\frac{\partial \hat{m}}{\partial t} = -\gamma \hat{m} \times (H_{eff} + H_T) + \alpha \hat{m} \times \frac{\partial \hat{m}}{\partial t} + \hat{\tau} \quad (1)$$

Where, $\hat{m}$ is a reduced magnetization of a magnetic layer, $\gamma$ is a gyromagnetic constant, $H_{eff}$ is an equivalent filed containing a uniaxial anisotropy field, a demagnetization field, a dipole field and an interlayer exchange coupling field. $H_T$ is a random thermal perturbation field, and a probability distribution thereof is a Gaussian normal distribution of $\mu=0$, $\sigma = \sqrt{2k_B T \alpha / V \gamma M_s \Delta \tau (1+\alpha^2)}$, where $k_B$ is Boltzmann constant, T is a temperature, B is a volume, Ms is a saturation magnetization, $\Delta \tau$ is a thermal perturbation time interval, and a spin transfer torque $\hat{\tau}$ can be represented by:

$$\hat{\tau} = \frac{\gamma \hbar J \eta}{2 e M_s d} \hat{m} \times \hat{m} \times \hat{p} \quad (2)$$

Where, e is an electron charge, J is a current density, $\eta$ is a spin torque efficiency, $\hbar$ is a reduced Planck constant, d is a film thickness, and $\hat{p}$ is a unit vector of the polarization current.

A magnitude of the spin transfer torque relates to an angle between $\hat{m}$ and $\hat{p}$. When the angle is 0 or $\pi$, the torque calculated according to the equation (2) is 0.

Figure 5:
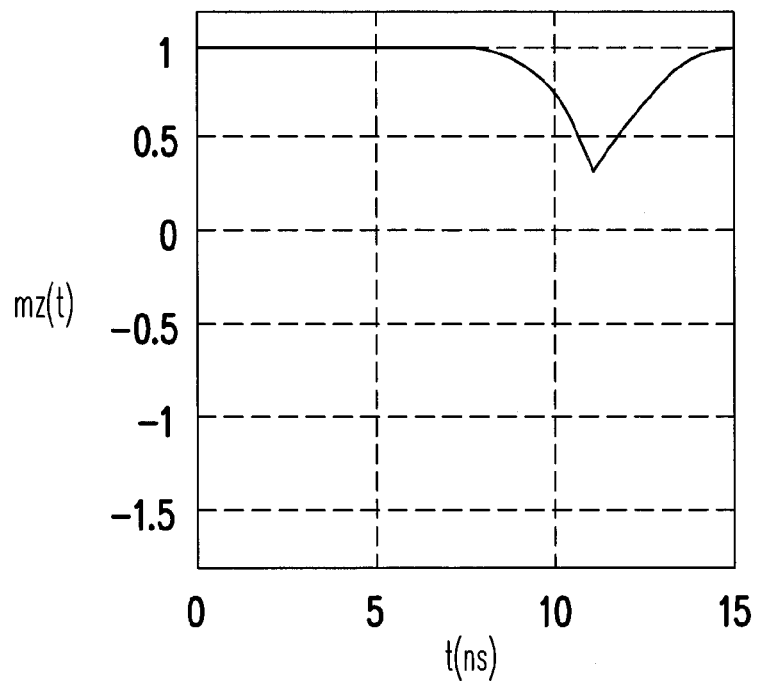
FIG. 5 is a diagram illustrating a switching state of a magnetization direction of a free layer without using a free assisting layer according to an exemplary embodiment of the disclosure.
Figure 6:
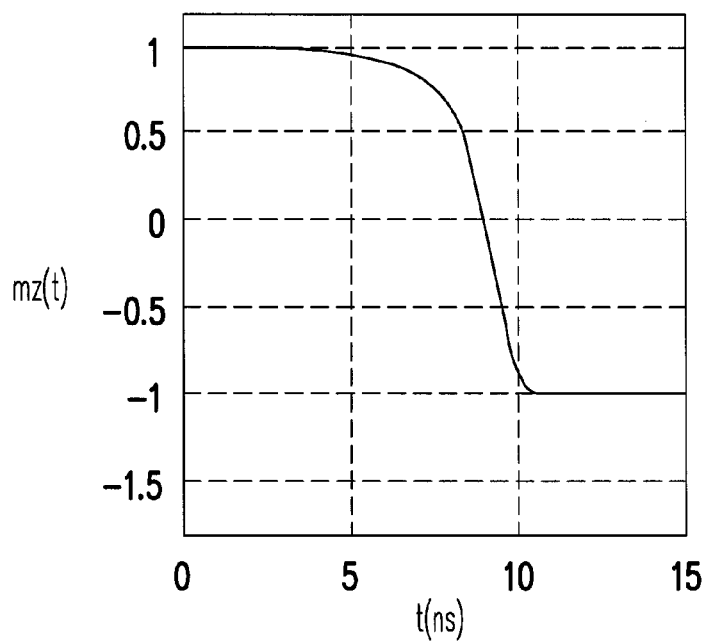
FIG. 6 is a diagram illustrating a switching state of a magnetization direction of a free layer in case that a free assisting layer is added though a coupling strength is 0 according to an exemplary embodiment of the disclosure.
Figure 7:
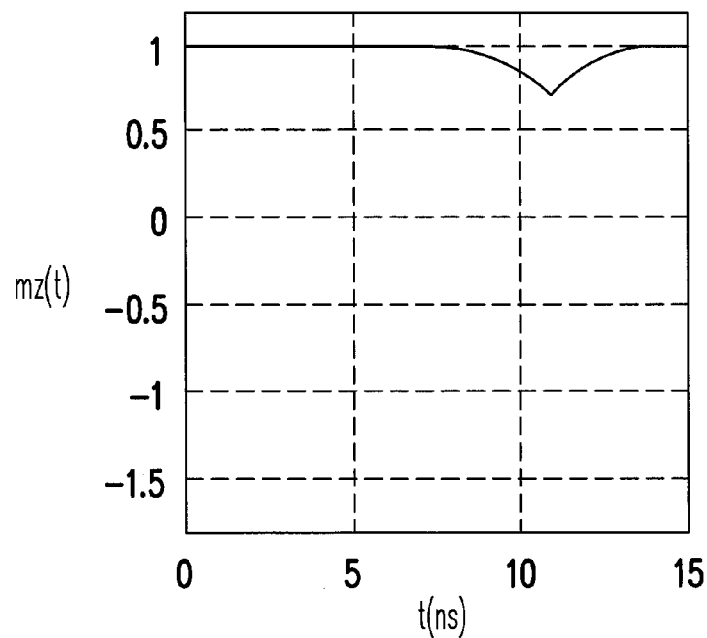
FIG. 7 is a diagram illustrating a switching state of a magnetization direction of a free layer in case that a free assisting layer is added though a coupling strength is strong according to an exemplary embodiment of the disclosure.

In the simulation, a polarization current with a current density $J_0$ is first provided to simulate a magnetization precession of the free layer 212 in case that only the single free layer 212 exists without the free assisting layer 216. It is discovered that under the current density $J_0$, the magnetization direction of the free layer 212 cannot be successfully switched under a length (10 ns) of the provided current pulse. As shown in FIG. 5, although the magnetization direction deviates from a Z-axis due to the spin transfer torque provided by the polarization current, after the current is turned off, the magnetization direction is returned back to the balanced direction (0, 0, 1) due to the perpendicular magnetic anisotropy. However, if the free assisting layer 216 is added in the simulation, and the spacer 214 is disposed between the free layer 212 and the free assisting layer 216 to ensure that besides the static magnetic field, none other interlayer exchange coupling exists there between, under the same current density $J_0$, the magnetization direction of the free layer 212 can be successfully switched from the direction (0, 0, 1) to the direction (0, 0, -1), as that shown in FIG. 6. The free assisting layer 216 reduces a critical current density required for switching the magnetization direction of the free layer 212. It should be noticed that when the current is not applied, the magnetization direction of the free assisting layer 216 is in a balanced position under the static magnetic field and its own demagnetization field, and when the current is applied, it may have a free precession due to interaction between the magnetic moment and the current. According to the simulation result, it is known that if the magnetization direction of the free assisting layer 216 is fixed through approaches such as an antiferromagnetic (AFM) layer, etc., the effect of reducing the switching current cannot be achieved.

A material of the spacer 214 may include Ta, Cu, Ru, Pd, Al, Ti, Au, Ag or alloys or combinations thereof, and a thickness thereof is not less than 20 Å, so that the interlayer exchange coupling between the free layer 212 and the free assisting layer 216 is too weak and can be neglected, for example, an absolute value of an exchange coupling constant J thereof is less than 0.001 mJ/m², though an actual design range thereof can also be adjusted according to a weakness degree to be achieved, so as to achieve the assisting switching effect of the free assisting layer 216. An example of a suitable spacer 214 is, for example, Cu of 50 Å. A material of the free assisting layer 216 can be a metal or an alloy containing Co, Fe and Ni, for example, NiFe, CoFeB, CoFe, Co, Ni, Fe, etc., and a thickness thereof is less than 50 Å. An example of a suitable free assisting layer 216 is, for example, NiFe of 20 Å.

In the spin transfer torque MRAM device using the free layer having the perpendicular magnetic anisotropy, a magnetic layer having an in-plane magnetic anisotropy is provided to assist switching the magnetization direction of the free layer having the perpendicular magnetic anisotropy, so as to reduce the critical current density required for switching. Further, a spacer is inserted between the magnetic layer having the in-plane magnetic anisotropy and the free layer having the perpendicular magnetic anisotropy, so that only a weak or none interlayer exchange coupling exists there between, so as to reduce the critical current density required for switching without influencing thermal stability or magnetoresistance of the device.

In another exemplary embodiment, the perpendicular magnetic anisotropy of the second magnetic layer 208 can be less than the perpendicular magnetic anisotropy of the first magnetic layer. In another exemplary embodiment, a thickness of the free layer 212 is less than a thickness of the pinned layer 204, which represents that the second magnetic layer 208 is thinner than the first magnetic layer 200, so that when the second magnetic layer 208 is switched, an operation current thereof does not switch the first magnetic layer 200.

Figure 8:
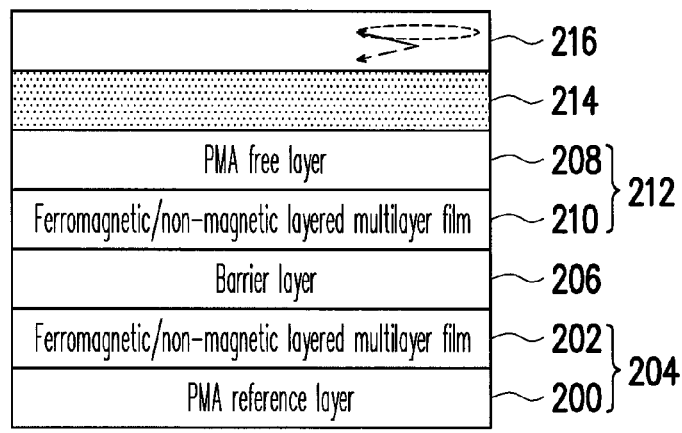
FIG. 8 is a cross-sectional view of a MRAM structure according to an exemplary embodiment of the disclosure.

Structures of the pinned layer 204 and the free layer 212 of FIG. 3 are described in detail below. FIG. 8 is a cross-sectional view of a MRAM structure according to an exemplary embodiment of the disclosure. Referring to FIG. 8, the structure of FIG. 8 is similar to that of FIG. 3, in which detailed structures of the pinned layer 204 and the free layer 212 are illustrated.

In the structure of the MRAM device 150, the first magnetic layer 200 of the pinned layer 204 is, for example, a PMA reference layer. The first polarization enhancement layer 202 is, for example, a magnetic layered multilayer film. The second polarization enhancement layer 210 is also a magnetic layered multilayer film. The second magnetic layer 208 is, for example, a PMA free layer.

The magnetic layered multilayer film structure of the first polarization enhancement layer 202 is, for example, a layered multilayer film formed by stacking ferromagnetic layers and non-magnetic layers in interlace, and is directly disposed on the first magnetic layer 200, where a magnetization direction thereof is coupled to be consistent to the magnetization direction of the first magnetic layer 200. The barrier layer 206 is directly disposed on the first polarization enhancement layer 202. The magnetic layered multilayer film structure of the second polarization enhancement layer 210 is directly disposed on the barrier layer 206, and a magnetization direction thereof is coupled to be consistent to the magnetization direction of the second magnetic layer 208. The first magnetic layer 208 is a PMA free layer, and is directly disposed on the second polarization enhancement layer 210 of the magnetic layered multilayer film structure, and has a second magnetization direction perpendicular to the second magnetic layer 208, which can be switched to be parallel or antiparallel to the first magnetization direction.

Figure 9:
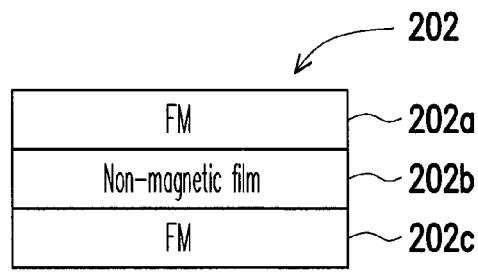
FIGS. 9-10 are schematic diagrams of a polarization enhancement layer according to an exemplary embodiment of the disclosure.
Figure 10:
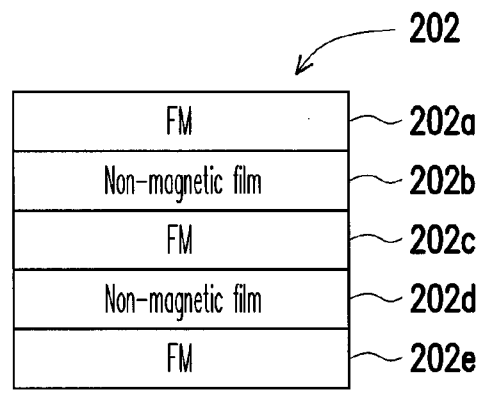

In the exemplary embodiment of FIG. 8, the magnetic layered multilayer film structures of the two polarization enhancement layers 202 and 210 serve as insertion layers, where a material of the barrier layer 206 is, for example, an MgO. Regarding a single magnetic layered multilayer film structure of, for example, the first polarization enhancement layer 202, it is a layered multilayer film formed by stacking ferromagnetic layers and non-magnetic layers in interlace. FIGS. 9-10 are schematic diagrams of a polarization enhancement layer according to an exemplary embodiment of the disclosure.

Referring to FIG. 9, regarding the magnetic layered multilayer film structure, two outmost layers thereof are ferromagnetic (FM) layers 202a and 202c, and ferromagnetic materials and non-magnetic materials are stacked in interlace between the two FM layers 202a and 202c according to a number of the stacked layers. Regarding the magnetic layered multilayer film structure of three layers, a non-magnetic film 202b is laminated between the two FM layers 202a and 202c.

In order to achieve better performance, a material of the FM layer 202a contacting the barrier layer 206 is still CoFeB, and a thickness thereof is, for example, 5-20 Å, and is preferably 10-15 Å. A material of the non-magnetic film 202b is, for example, Ta, Ru, Cr, Al, Mg, Cu, Ti or Pt. A thickness of the non-magnetic film 202b is, for example, 0.5-5 Å, and is preferably 0.5-3 Å. A material of the FM layer 202c contacting the first magnetic layer 200 is, for example, a ferromagnetic material containing Co, which is preferably a material of Co, CoFe or CoFeB, though the material of the FM layer 202C can also be other ferromagnetic materials having the same effect, for example, Fe, Ni or NiFe. A thickness of the FM layer 202c is, for example, 1-6 Å, and is preferably 3-5 Å.

The magnetic layered multilayer film structure of the second polarization enhancement layer 210 is also as that shown in FIG. 9, though the FM layer 202a contacts the second magnetic layer 208, and the FM layer 202c contacts the barrier layer 206. Namely, the magnetic layered multilayer film structures of the two polarization enhancement layers 202 and 210 are symmetric relative to the barrier layer 206.

Furthermore, the number of layers of the magnetic layered multilayer film is limited to be three, which can be more than three. Referring to FIG. 10, the magnetic layered multilayer film is a structure having five layers, which is formed by stacking three layers of FM layers 202a, 202c and 202e and two layers of non-magnetic films 202b and 202d in interlace. The FM layer 202a contacts the barrier layer 206, and the FM layer 202e contacts the first magnetic layer 200.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A magnetic random access memory, having a perpendicular magnetization direction, comprising:
    a pinned layer, comprising a first magnetic layer and a first polarization enhancement layer, and having a first magnetization direction and a first perpendicular magnetic anisotropy;
    a free layer, comprising a second magnetic layer and a second polarization enhancement layer, and having a second magnetization direction and a second perpendicular magnetic anisotropy;
    a barrier layer, formed between the pinned layer and the free layer, wherein the first polarization enhancement layer is disposed between the first magnetic layer and the barrier layer, the second polarization enhancement layer is disposed between the second magnetic layer and the barrier layer, and the barrier layer is disposed between the first polarization enhancement layer and the second polarization enhancement layer;
    a spacer, formed on the free layer; and
    a free assisting layer, disposed on the spacer, and having an in-plane magnetic anisotropy, and having a magnetization direction capable of being freely varied,
    wherein the spacer and the barrier layer are disposed on opposite sides of the free layer.

2. The magnetic random access memory as claimed in claim 1, wherein the first perpendicular magnetic anisotropy is greater than the second perpendicular magnetic anisotropy.

3. The magnetic random access memory as claimed in claim 1, wherein the first magnetic layer and the second magnetic layer are single-layer film structures containing a ferromagnetic material of Co or Fe, or layered multilayer film structures formed by stacking a ferromagnetic material and a non-magnetic material in interlace.

4. The magnetic random access memory as claimed in claim 1, wherein the first polarization enhancement layer and the second polarization enhancement layer are single-layer film structures containing a ferromagnetic material of Co or Fe, or layered multilayer film structures formed by stacking a ferromagnetic material and a non-magnetic material in interlace.

5. The magnetic random access memory as claimed in claim 1, wherein a material of the barrier layer is magnesium oxide or aluminium oxide.

6. The magnetic random access memory as claimed in claim 1, wherein a thickness of the spacer maintains a coupling strength between the free assisting layer and the first magnetic layer in a range of 20 Å-50 Å.

7. The magnetic random access memory as claimed in claim 6, wherein an absolute value of an exchange coupling constant J of the coupling strength is less than 0.001 mJ/m$^2$.

8. The magnetic random access memory as claimed in claim 1, wherein the magnetization direction of the free assisting layer is parallel or nearly parallel to a horizontal direction before a current is applied.

9. The magnetic random access memory as claimed in claim 1, wherein the second magnetization direction of the free layer is parallel or antiparallel to the first magnetization direction of the pinned layer along with a polarity of a current perpendicularly flowing through.

* * * * *